US010607656B2

(12) United States Patent
Chen et al.

(10) Patent No.: US 10,607,656 B2
(45) Date of Patent: Mar. 31, 2020

(54) MOUNTING APPARATUS FOR DISC DRIVES AND ELECTRONIC DEVICE USING THE SAME

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Ching-Jou Chen, New Taipei (TW); Wen-Hsiang Hung, New Taipei (TW); Chun-Bao Gu, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 7 days.

(21) Appl. No.: 15/960,650

(22) Filed: Apr. 24, 2018

(65) Prior Publication Data

US 2019/0180792 A1  Jun. 13, 2019

(30) Foreign Application Priority Data

Dec. 11, 2017 (CN) .......................... 2017 1 1336690

(51) Int. Cl.
| G11B 33/12 | (2006.01) |
| F16B 2/22 | (2006.01) |
| G06F 1/18 | (2006.01) |
| H05K 7/14 | (2006.01) |
| H05K 5/02 | (2006.01) |
| G11B 25/10 | (2006.01) |
| G11B 33/14 | (2006.01) |

(52) U.S. Cl.
CPC .............. *G11B 33/124* (2013.01); *F16B 2/22* (2013.01); *G06F 1/187* (2013.01); *G11B 25/10* (2013.01); *G11B 33/1406* (2013.01); *H05K 5/0204* (2013.01); *H05K 5/0221* (2013.01); *H05K 7/1401* (2013.01)

(58) Field of Classification Search
CPC ..... G06F 1/187; G11B 33/124; G11B 33/128; H05K 5/0221; H05K 7/1401; H05K 7/14; H05K 5/0204; F16B 2/22
See application file for complete search history.

(56) References Cited

U.S. PATENT DOCUMENTS

| 2007/0153466 A1* | 7/2007 | Chen ....................... G06F 1/187 361/679.31 |
| 2013/0170130 A1* | 7/2013 | Lai ....................... H05K 5/0221 361/679.33 |
| 2014/0268567 A1* | 9/2014 | Yin ....................... H05K 5/0221 361/694 |

* cited by examiner

Primary Examiner — James Wu
(74) Attorney, Agent, or Firm — ScienBiziP, P.C.

(57) ABSTRACT

An apparatus for mounting a hard disk drive unit and an optical disk drive unit to an electronic device includes a supporting bracket defining an accommodating space for the hard disk drive unit and the optical disk drives unit and a clip. The supporting bracket includes a connecting plate and a resilient latching member attached to the connecting plate and located within the connecting plate. The clip corresponds to the resilient latching member and is configured to be attached to the optical disk drive unit. The resilient latching member is switchable between a clip-locking position and a clip-unlocking position.

14 Claims, 6 Drawing Sheets

MOUNTING APPARATUS FOR DISC DRIVES AND ELECTRONIC DEVICE USING THE SAME

FIELD

The subject matter herein generally relates to mounting apparatus for hard disc drives (HDD) and optical disc drives (ODD) and electronic devices using the mounting apparatus.

BACKGROUND

A computer casing can have a combination of ODD and HDD mounting frames. The combination of mounting frames is configured to enable both an ODD and an HDD to be mounted therein, thus realizing a thinner computer casing. The mounting frame generally extends towards a heat-producing module. A mounting apparatus that can avoid interference with the heat producing module to protect the ODD and HDD from overheating is needed.

BRIEF DESCRIPTION OF THE DRAWINGS

Implementations of the present disclosure will now be described, by way of example only, with reference to the attached figures.

DETAILED DESCRIPTION

Figure 1:
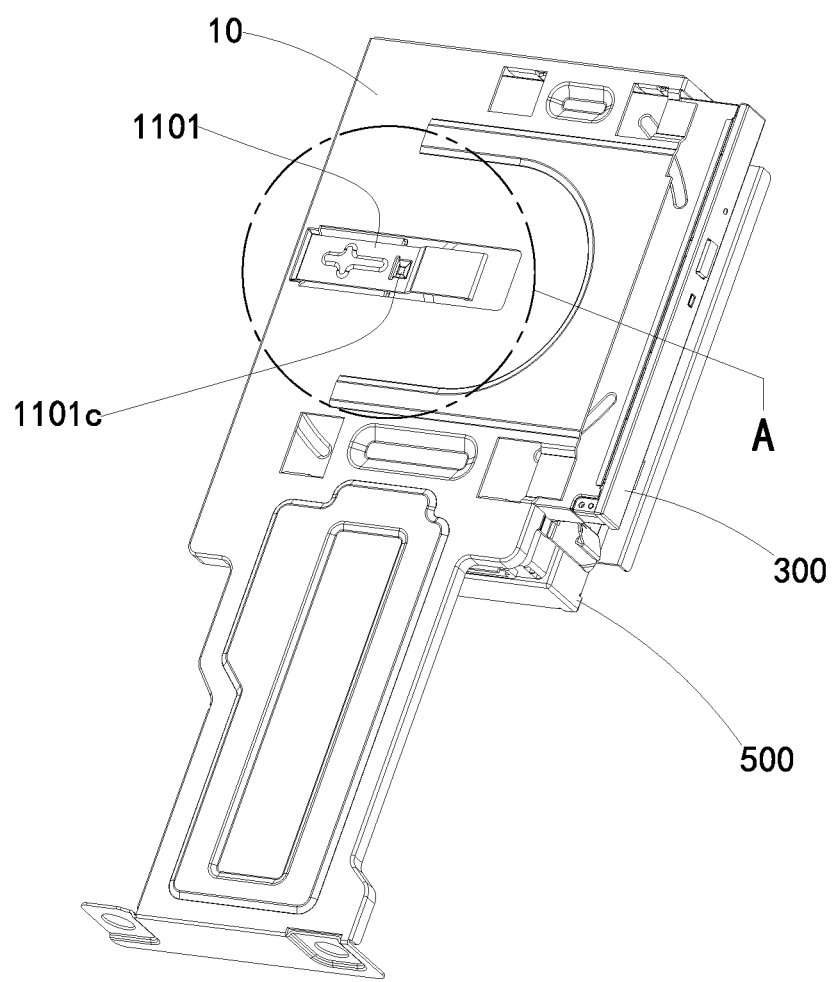
FIG. 1 illustrates an isometric view of a first embodiment of an electronic device.
Figure 2:
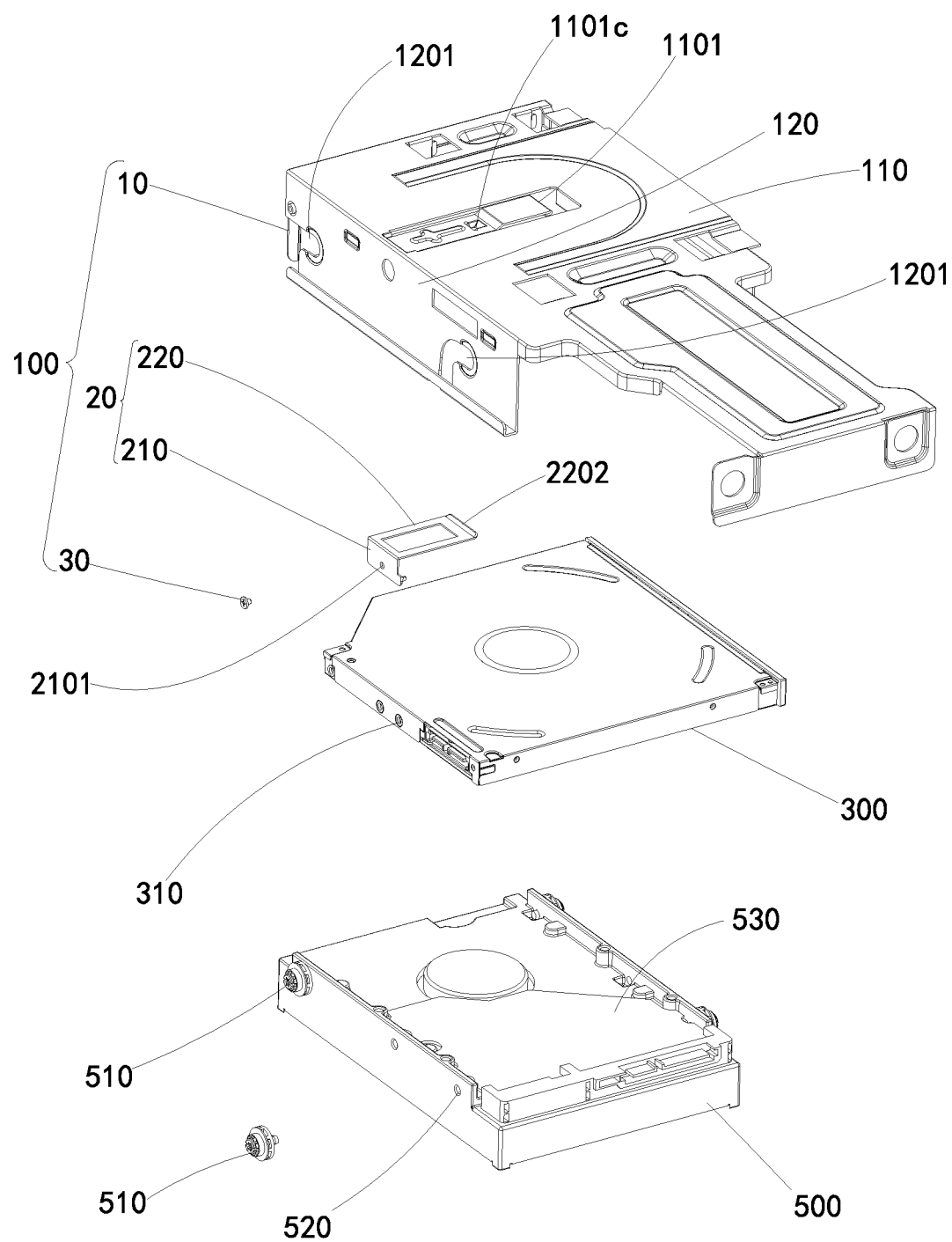
FIG. 2 illustrates an exploded view of the electronic device of FIG. 1.
Figure 3:
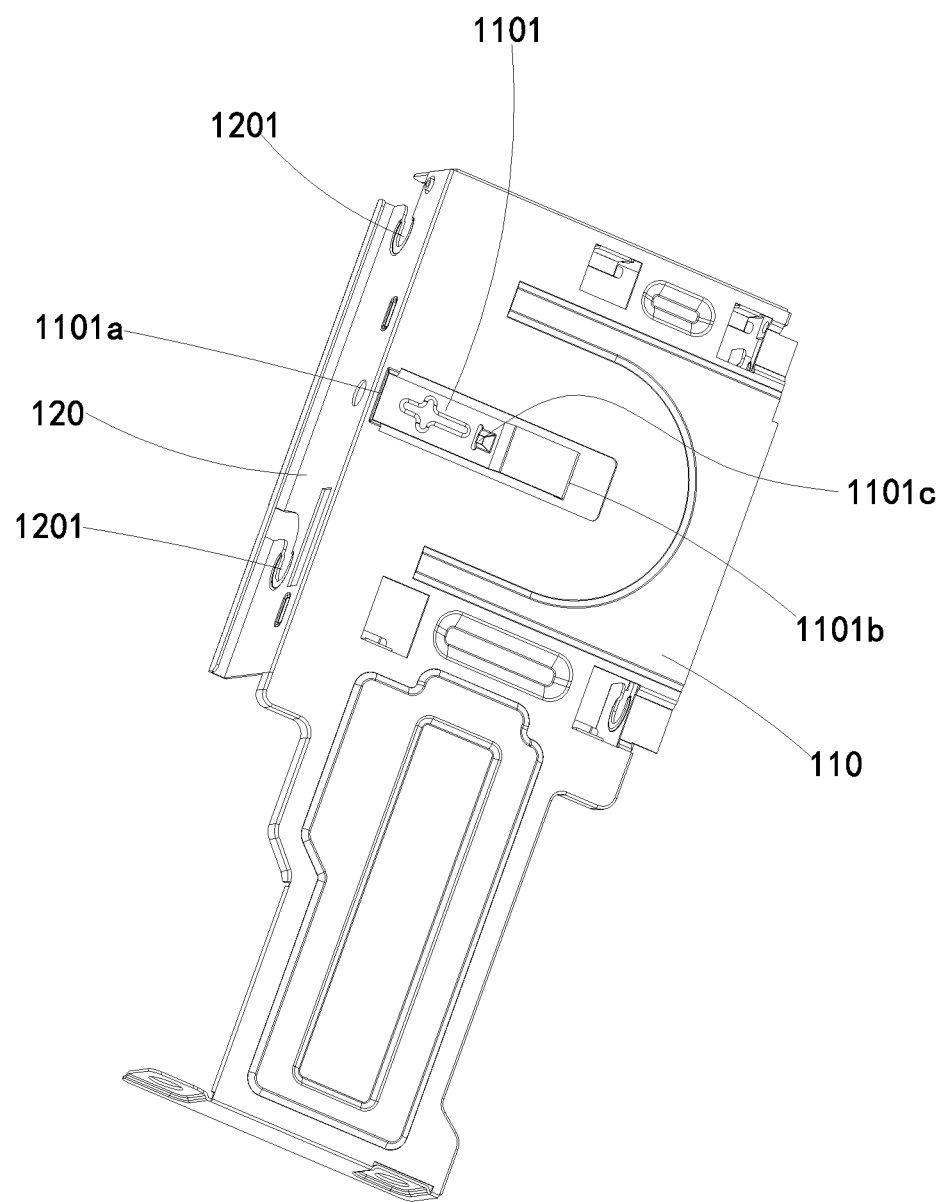
FIG. 3 illustrates an isometric view of a supporting bracket of the electronic device of FIG. 1.
Figure 4:
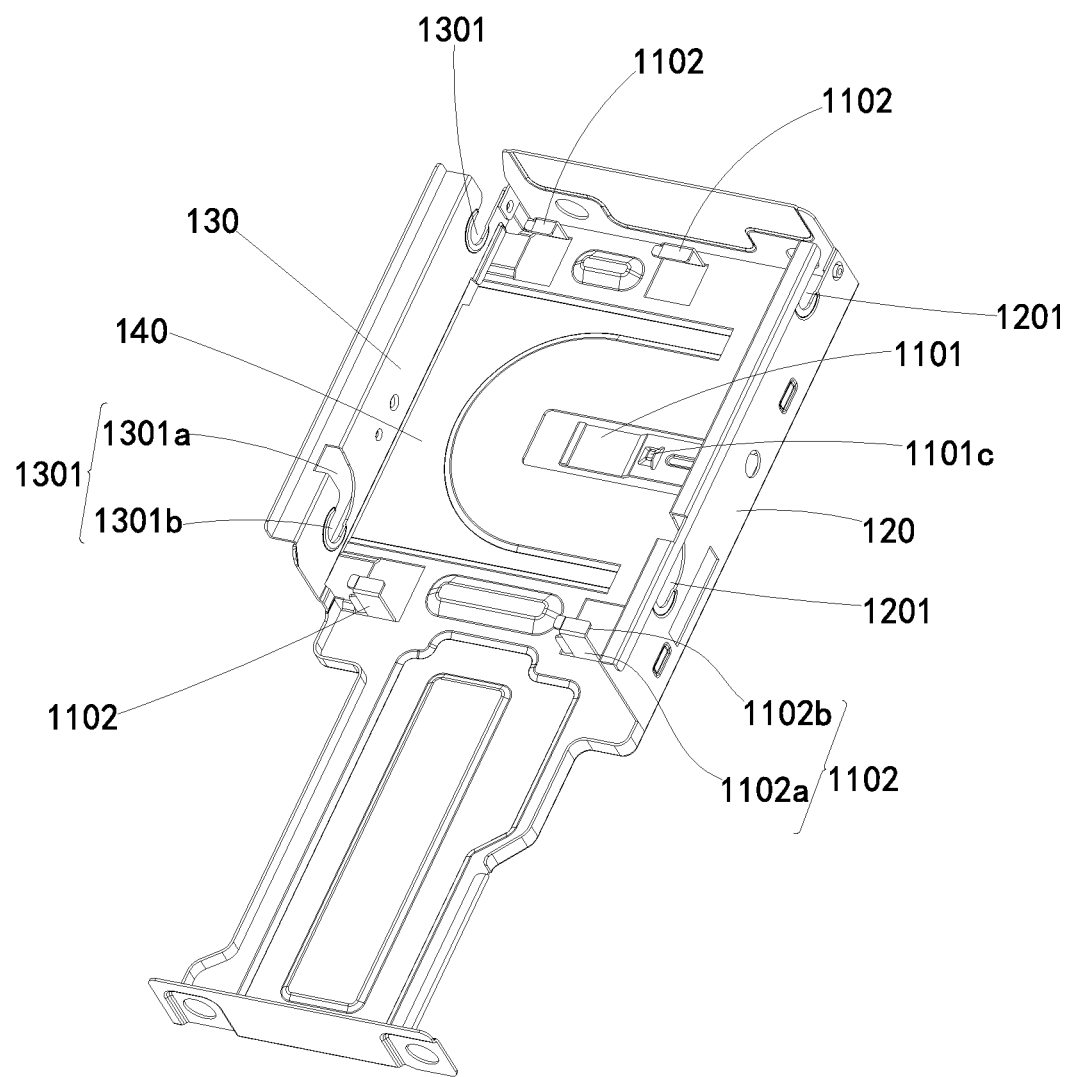
FIG. 4 illustrates an isometric view of the supporting bracket of the electronic device of FIG. 1, showing the supporting bracket from a different angle.
Figure 5:
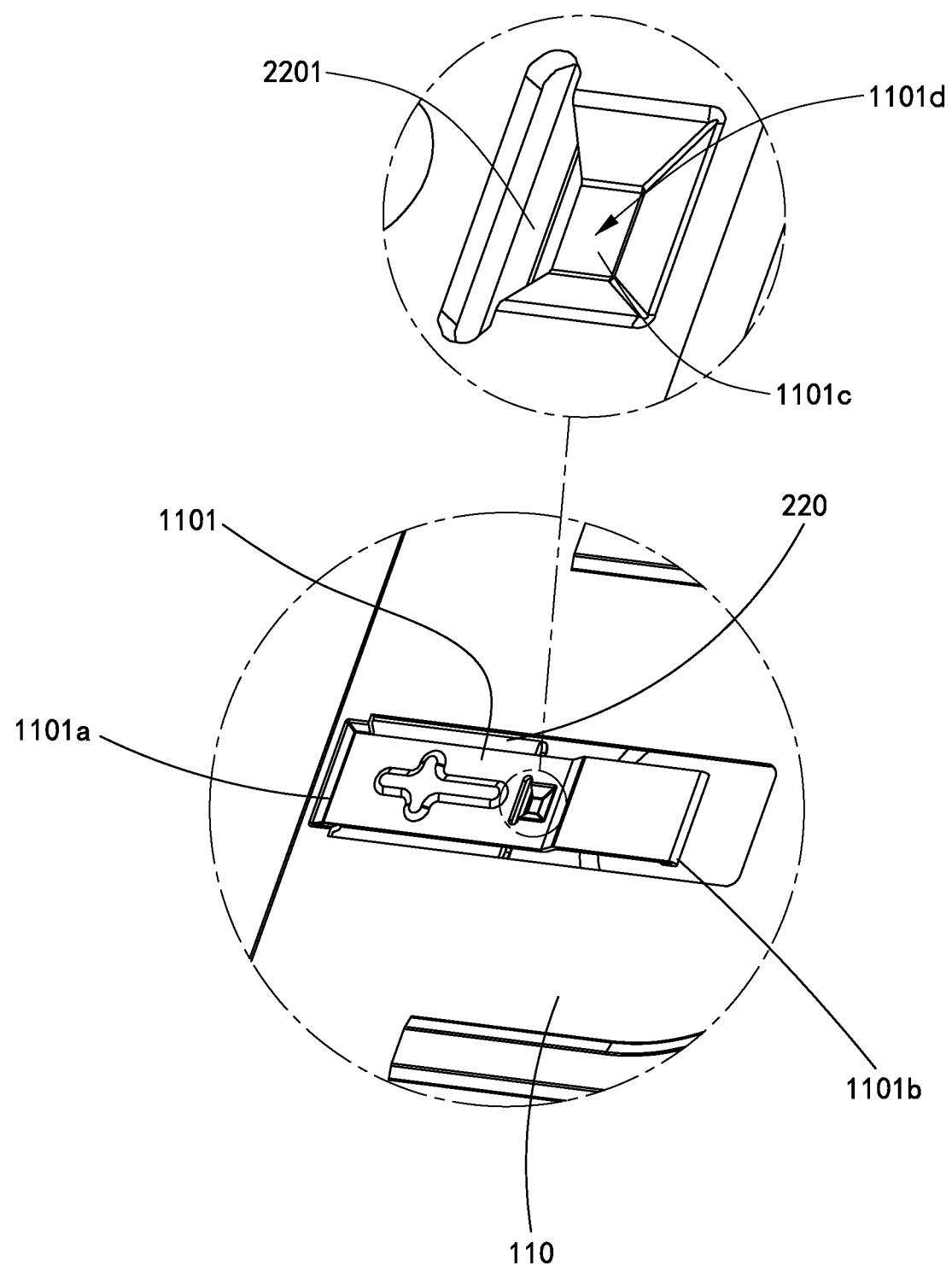
FIG. 5 illustrates an enlarged view of circled portion A of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like.

FIGS. 1-5 illustrate a portion of an electronic device 200. The electronic device 200 includes an optical disk drive unit (ODD 300), a hard disk drive unit (HDD 500), and a mounting apparatus 100.

The mounting apparatus 100 is used to mount the HDD 500 and the ODD 300 inside the electronic device 200. The mounting apparatus 100 can include a supporting bracket 10, a clip 20, and a plurality of screws 30.

The supporting bracket 10 defines an accommodating space 140 for receiving the HDD 500 and the optical disk drives unit 300, and the supporting bracket 10 includes a connecting plate 110 and a resilient latching member 1101. The resilient latching member 1101 is attached to the connecting plate 110 and is located within a groove in the connecting plate 110.

The clip 20 corresponds to the resilient latching member 1101, and the clip 20 is configured to be attached to the optical disk drive unit 300.

The resilient latching member 1101 is switchable between a locking position and an unlocking position. When in the locking position, the resilient latching member 1101 locks the clip 20 in one position. When in the unlocking position, the resilient latching member 1101 unlocks the clip 20, allowing it to move. For example, the resilient latching member 1101 can be an elastic strip, the elastic strip is pre-tensioned to stay in the locking position.

When the ODD 300 is installed to the accommodating space 140 of the supporting bracket 10, the clip 20 moves along with the ODD 300 until the clip 20 hooks with the resilient latching member 1101. The ODD 300 is kept at a predetermined position by the clip 20 and the resilient latching member 1101. When the ODD 300 is to be removed from the supporting bracket 10, the clip 20 and the resilient latching member 1101 can be separated by manual operation.

The resilient latching member 1101 includes a connecting end 1101a, a free end 1101b, and a latching portion 1101c.

The connecting end 1101a can be attached to the connecting plate 110. The free end 1101b is opposite to the connecting end 1101a. The latching portion 1101c is located between the connecting end 1101a and the free end 1101b.

The connecting plate 110 defines an opening 1101d corresponding to the latching portion 1101c, and the latching portion 1101c couples with the clip 20 through the opening.

The connecting end 1101a can be connected to an edge of the opening. For example, the resilient latching member 1101 and the connecting plate 110 can be punch-formed so as to be integral with each other.

An extension direction of the resilient latching member 1101 can be parallel with the installation direction of the ODD 300.

In at least one embodiment, the mounting apparatus further includes a plurality of guiding members 1102. Each guiding member 1102 includes a cantilever 1102a and a supporting board 1102b.

The cantilever 1102a includes two opposite ends, and the cantilever 1102a is perpendicularly connected to the connecting plate 110 through one of the two opposite ends.

The supporting board 1102b is configured to support the optical disk drive unit 300. The supporting board 1102b is perpendicularly connected to the cantilever 1102a through the other one of the two opposite ends. The supporting board 1102b is parallel with the connecting plate 110.

The clip 20 includes a mounting plate 210 and a clamping plate 220. The mounting plate 210 defines at least one mounting hole 2101. The clamping plate 220 is perpendicularly connected to the mounting plate 210, and the clamping plate 220 includes a hook 2202 corresponding to the resilient latching member 1101.

A first screw hole 310 is defined in the optical disk drive unit 300. The clip 20 can be attached to the optical disk drive unit 300 using the screws 30, the mounting hole 2101, and the first screw hole 310.

In at least one embodiment, the supporting bracket 10 further includes a first side plate 120 and a second side plate 130.

The first side plate 120 is perpendicularly connected to one side of the connecting plate 110. The second side plate 130 is connected to another side of the connecting plate 110 and parallel with the first side plate 120.

The first side plate 120 defines at least one receiving slot 1201, and the second side plate 130 defines at least one receiving slot 1301. The mounting apparatus further includes a plurality of sliding pillars 510 corresponding to the receiving slots 1201, 1301, and the sliding pillars 510 are configured to be attached to the HDD 500 and received in the receiving slots 1201, 1301. For example, the HDD 500 includes a main body 530, and second screw holes 520 are defined in the main body 530. The sliding pillar 510 is a stud, and one end of each sliding pillar 510 is screwed to one of the second screw holes 520.

Each of the receiving slots 1201, 1301 includes a guiding portion and a clamping portion interconnected with the guiding portion. For example, the receiving slot 1301 includes a guiding portion 1301a and a clamping portion 1301b interconnected with the guiding portion 1301a.

When a sliding pillar 510 slides to the clamping portion 1301b through the guiding portion 1301a, the HDD 500 is mounted to the supporting bracket 10 through the sliding pillars 510 and the clamping portion 1301b.

Figure 6:
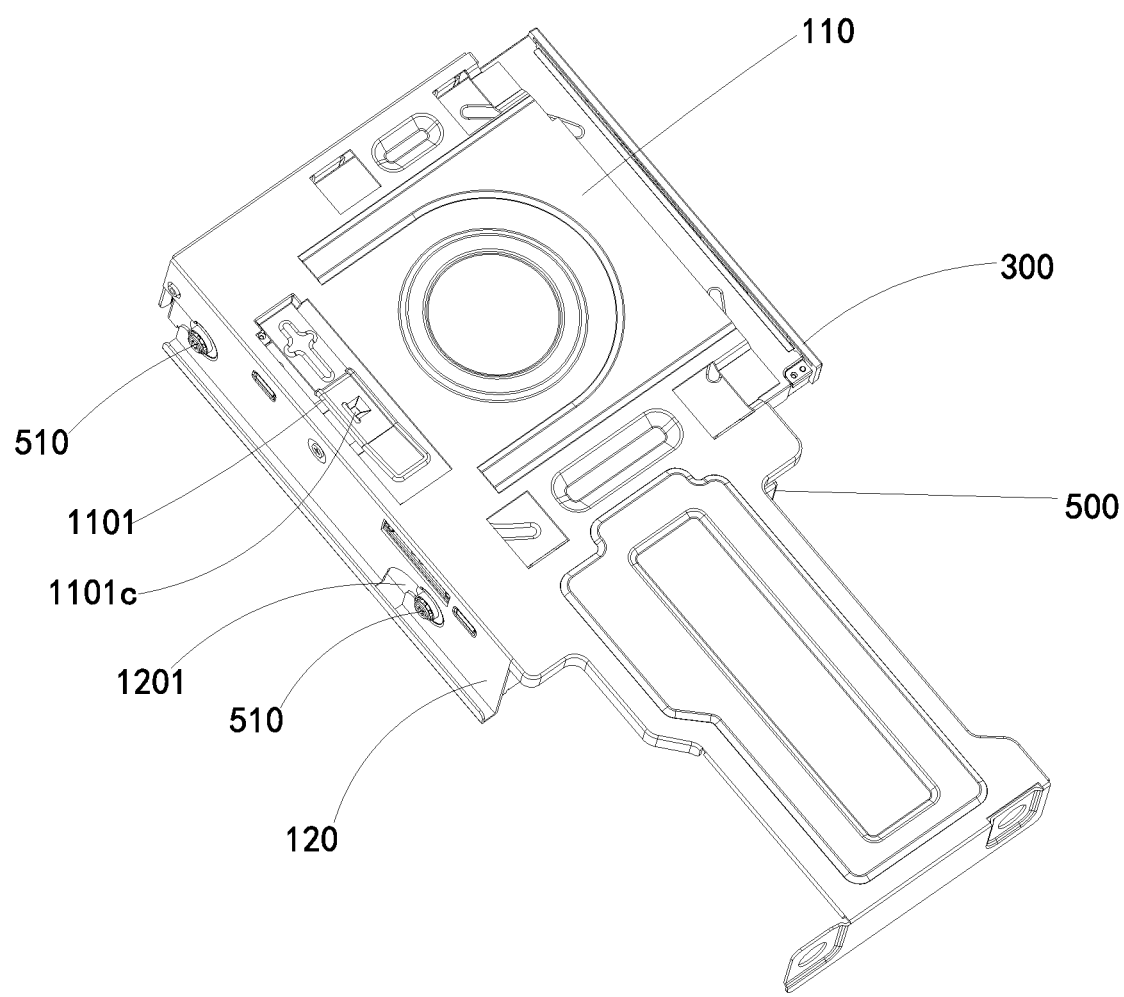
FIG. 6 illustrates an isometric view of a second embodiment of an electronic device.

Referring to FIG. 6, in at least one embodiment, an extension direction of the resilient latching member 1101 can be perpendicular to the installation direction of the ODD 300.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A mounting apparatus for mounting a hard disk drive unit and an optical disk drive unit within an electronic device, the mounting apparatus, comprising:
   a supporting bracket defining an accommodating space for the hard disk drive unit and the optical disk drives unit, comprising:
   a connecting plate; and
   a resilient latching member attached to the connecting plate and located within the connecting plate; and
   a clip corresponding to the resilient latching member, comprising:
   a mounting plate defining at least one mounting hole; and
   a clamping plate perpendicularly connected to the mounting plate, and the clamping plate comprising a hook corresponding to the resilient latching member;
   wherein the clip is configured to be attached to the optical disk drive unit through fixing members and the mounting hole;
   wherein the resilient latching member is switchable between a locking position, where the resilient latching member locks the clip, and an unlocking position, where the resilient latching member unlocks the clip.

2. The mounting apparatus of claim 1, wherein the resilient latching member comprises:
   a connecting end attached to the connecting plate;
   a free end opposite to the connecting end; and
   a latching portion located between the connecting end and the free end;
   wherein the connecting plate defines an opening corresponding to the latching portion, and the latching portion couples with the clip through the opening.

3. The mounting apparatus of claim 2, wherein the connecting end is connected to an edge of the opening.

4. The mounting apparatus of claim 3, wherein the resilient latching member and the connecting plate are integratedly punch-formed.

5. The mounting apparatus of claim 1, wherein the mounting apparatus further comprises a plurality of guiding members, each of the guiding members comprises:
   a cantilever comprising two opposite ends, wherein the cantilever is perpendicularly connected to the connecting plate through one of the two opposite ends; and
   a supporting board configured to support the optical disk drive unit, wherein the supporting board is perpendicularly connected to the cantilever through the other one of the two opposite ends, and the supporting board is parallel with the connecting plate.

6. The mounting apparatus of claim 1, wherein the supporting bracket further comprising:
   a first side plate perpendicularly connected to one side of the connecting plate; and
   a second side plate connected to another side of the connecting plate and parallel with the first side plate;
   wherein each of the first side plate and the second side plate defines at least one receiving slot, and the mounting apparatus further comprising a plurality of sliding pillars corresponding to the at least one receiving slot, and the sliding pillars are configured to be attached to the hard disk drive unit and received in the at least one receiving slot.

7. The mounting apparatus of claim 6, wherein the receiving slot comprising:
   a guiding portion; and
   a clamping portion interconnected with the guiding portion;
   when the sliding pillars slide to the clamping portion through the guiding portion, the hard disk drive unit is mounted to the supporting bracket through the sliding pillars and the clamping portion.

8. An electronic device comprising:
   a hard disk drive unit;
   an optical disk drive unit; and
   a mounting apparatus for mounting the hard disk drive unit and the optical disk drive unit, comprising:
   a supporting bracket defining an accommodating space for the hard disk drive unit and the optical disk drives unit, comprising:
   a connecting plate; and
   a resilient latching member attached to the connecting plate and located within the connecting plate; and
   a clip corresponding to the resilient latching member, comprising:
   a mounting plate defining at least one mounting hole; and a clamping plate perpendicularly connected to the mounting plate, and the clamping plate comprising a hook corresponding to the resilient latching member;

wherein the clip is configured to be attached to the optical disk drive unit through fixing members and the mounting hole;

wherein the resilient latching member is switchable between a locking position, where the resilient latching member locks the clip, and an unlocking position, where the resilient latching member unlocks the clip.

9. The electronic device of claim 8, wherein the resilient latching member comprises:
a connecting end attached to the connecting plate;
a free end opposite to the connecting end; and
a latching portion located between the connecting end and the free end;
wherein the connecting plate defines an opening corresponding to the latching portion, and the latching portion couples with the clip through the opening.

10. The electronic device of claim 9, wherein the connecting end is connected to an edge of the opening.

11. The electronic device of claim 10, wherein the resilient latching member and the connecting plate are integratedly punch-formed.

12. The electronic device of claim 8, wherein the mounting apparatus further comprises a plurality of guiding members, each of the guiding members comprises:

a cantilever comprising two opposite ends, wherein the cantilever is perpendicularly connected to the connecting plate through one of the two opposite ends; and
a supporting board configured to support the optical disk drive unit, wherein the supporting board is perpendicularly connected to the cantilever through the other one of the two opposite ends, and the supporting board is parallel with the connecting plate.

13. The electronic device of claim 8, wherein the supporting bracket further comprising:
a first side plate perpendicularly connected to one side of the connecting plate; and
a second side plate connected to another side of the connecting plate and parallel with the first side plate;
wherein each of the first side plate and the second side plate defines at least one receiving slot, and the mounting apparatus further comprising a plurality of sliding pillars corresponding to the at least one receiving slot, and the sliding pillars are configured to be attached to the hard disk drive unit and received in the at least one receiving slot.

14. The electronic device of claim 13, wherein the receiving slot comprising:
a guiding portion; and
a clamping portion interconnected with the guiding portion;
when the sliding pillars slide to the clamping portion through the guiding portion, the hard disk drive unit is mounted to the supporting bracket through the sliding pillars and the clamping portion.

* * * * *